(12) United States Patent  
Rofougaran

(10) Patent No.: US 7,088,185 B2  
(45) Date of Patent: *Aug. 8, 2006

(54) ANTENNA DIVERSITY STRUCTURE FOR USE IN A RADIO FREQUENCY INTEGRATED CIRCUIT

(75) Inventor: Ahmadreza (Reza) Rofougaran, Marina Del Ray, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/021,652

(22) Filed: Dec. 22, 2004

(65) Prior Publication Data

US 2005/0134387 A1    Jun. 23, 2005

Related U.S. Application Data

(63) Continuation of application No. 10/657,314, filed on Sep. 8, 2003, now Pat. No. 6,882,228.

(51) Int. Cl.  
*H03F 3/04* (2006.01)

(52) U.S. Cl. .................................. 330/301; 330/275

(58) Field of Classification Search ............... 330/301, 330/124 R, 165, 116, 117, 275, 276; 333/25; 327/563, 564  
See application file for complete search history.

(56) References Cited

U.S. PATENT DOCUMENTS

| | | | | |
|---|---|---|---|---|
| 3,714,597 A | * | 1/1973 | Reynolds | 330/275 |
| 4,916,410 A | * | 4/1990 | Littlefield | 330/295 |
| 5,017,886 A | * | 5/1991 | Geller | 330/277 |
| 5,614,863 A | * | 3/1997 | Pierro et al. | 330/1 R |
| 6,097,250 A | * | 8/2000 | Kamali et al. | 330/124 R |
| 6,201,439 B1 | * | 3/2001 | Ishida et al. | 330/124 R |
| 6,809,581 B1 | * | 10/2004 | Rofougaran et al. | 327/563 |
| 6,882,228 B1 | * | 4/2005 | Rofougaran | 330/301 |
| 6,961,026 B1 | * | 11/2005 | Toda | 343/817 |

* cited by examiner

*Primary Examiner*—Henry Choe  
(74) *Attorney, Agent, or Firm*—Garlick Harrison & Markison; Timothy W. Markison

(57) ABSTRACT

A radio frequency integrated circuit includes a power amplifier, a low noise amplifier, a first transformer balun, and a second transformer balun. The power amplifier includes a first power amplifier section and a second power amplifier section. When enabled, the first and second power amplifier sections amplify an outbound radio frequency (RF) signal to produce a first amplified outbound RF signal and a second amplified outbound RF signal, respectively. The power amplifier provides the first amplified outbound RF signal to the first transformer balun and the second outbound RF signal to the second transformer balun, where the first transformer balun is coupled to a first antenna and the second transformer balun is coupled to a second antenna. The low noise amplifier includes a first low noise amplifier section and a second low noise amplifier section. When enabled, the first low noise amplifier section amplifies a first inbound RF signal to produce a first amplified inbound RF signal, and, when enabled, the second low noise amplifier section amplifies a second inbound RF signal to produce a second amplified inbound RF signal. The low noise amplifier receives the first inbound RF signal from the first transformer balun and receives the second inbound RF signal from the second transformer balun.

8 Claims, 7 Drawing Sheets

LNA 72

LNA 72

LNA 72

PA 84

PA 84

ANTENNA DIVERSITY STRUCTURE FOR USE IN A RADIO FREQUENCY INTEGRATED CIRCUIT

This patent application is claiming priority under 35 USC § 120 as a continuing patent application of patent application entitled RADIO FREQUENCY INTEGRATED CIRCUIT HAVING AN ANTENNA DIVERSITY STRUCTURE, having a filing date of Sep. 8, 2003, and a Ser. No. 10/657,314 now U.S. Pat. No. 6,882,228.

TECHNICAL FIELD OF THE INVENTION

This invention relates generally to communication systems and, more particularly, to radio receivers and transmitters used within such communication systems.

DESCRIPTION OF RELATED ART

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

To recapture data from RF signals, a receiver includes a low noise amplifier, down conversion module and demodulation module. To convert data into RF signals, a transmitter includes a power amplifier, an up-conversion module and a modulation module. For radio frequency integrated circuits (RFICs), it is desirable to provide the low noise amplifier and the power amplifier with differential RF signals, instead of single-ended RF signals, to improve noise performance and common mode rejection. To convert received single-ended RF signals into differential RF signals for a receiver, and to convert differential RF signals into single-ended signals for a transmitter, the receiver and/or the transmitter includes a balun (i.e., a balanced/unbalanced transformer).

An issue that arises with most wireless communication devices is fading. As is known, fading is a by-product of multiple path communications in which a transmitted signal is received via multiple communication paths. The multiple communication paths include a direct path between the transmitter and receiver and reflected paths where the transmitted signal bounces off of objects (e.g., buildings, hills, mountains, etc.) before being received. Each of the multiple paths have different lengths, thus the signal is received multiple times at different phases. In some instances, the phase differences align to dramatically reduce the signal strength of the received signal, which may cause interruption of a communication.

One solution to minimize the reduction of signal strength due to fading is to include a diversity antenna arrangement within the wireless communication device. As is known, a diversity antenna arrangement includes two or more antennas that are physically spaced by a distance corresponding to a quarter wavelength, a half wavelength, and/or a full wavelength of the RF signals. By spacing the antennas in such a manner, one antenna may be experiencing significant fading, while another antenna is not. Thus, the antenna not experiencing the fading can be selected for the communication.

Currently, when a wireless communication device includes a radio frequency integrated circuit (RFIC) to perform the conversion of outbound data into outbound RF signals and to convert inbound RF signals into inbound data, the circuitry for a diversity antenna structure is off-chip. In particular, the power amplifier and low noise amplifier of the radio are on-chip, but the antenna switch for transmit/receive selection, the antenna switch for diversity antenna selection, and the impedance matching circuitry are off-chip. With consume demand for more integration, it is desirable to integrate as much of the diversity antenna structure as possible.

Therefore, a need exists for an integrated radio frequency (RF) integrated circuit that includes a diversity antenna structure.

BRIEF SUMMARY OF THE INVENTION

The antenna diversity structure of use in a radio frequency integrated circuit (RFIC) of the present invention substantially meets these needs and others. In one embodiment, a power amplifier structure includes a first transformer balun, a second transformer balun, a first power amplifier section, and a second power amplifier section. The first transformer balun is operably coupled to a first antenna of a diversity antenna structure. The second transformer balun is operably coupled to a second antenna of a diversity antenna structure. The first and second power amplifier sections amplify an outbound radio frequency (RF) signal to produce a first amplified outbound RF signal and a second amplified outbound RF signal, respectively, and the first amplified outbound RF signal is provided to the first transformer balun and the second outbound RF signal is provided to the second transformer balun.

In another embodiment, a low noise amplifier structure includes a first transformer balun, a second transformer balun, a first low noise amplifier section, and a second low noise amplifier section. The first transformer balun is operably coupled to a first antenna of a diversity antenna structure. The second transformer balun is operably coupled to a second antenna of a diversity antenna structure. When enabled, the first low noise amplifier section amplifies a first inbound RF signal to produce a first amplified inbound RF signal. When enabled, the second low noise amplifier section amplifies a second inbound RF signal to produce a second amplified inbound RF signal. The first inbound RF signal is received via the first transformer balun and the second inbound RF signal is received via the second transformer balun.

DETAILED DESCRIPTION OF THE INVENTION

Figure 1:
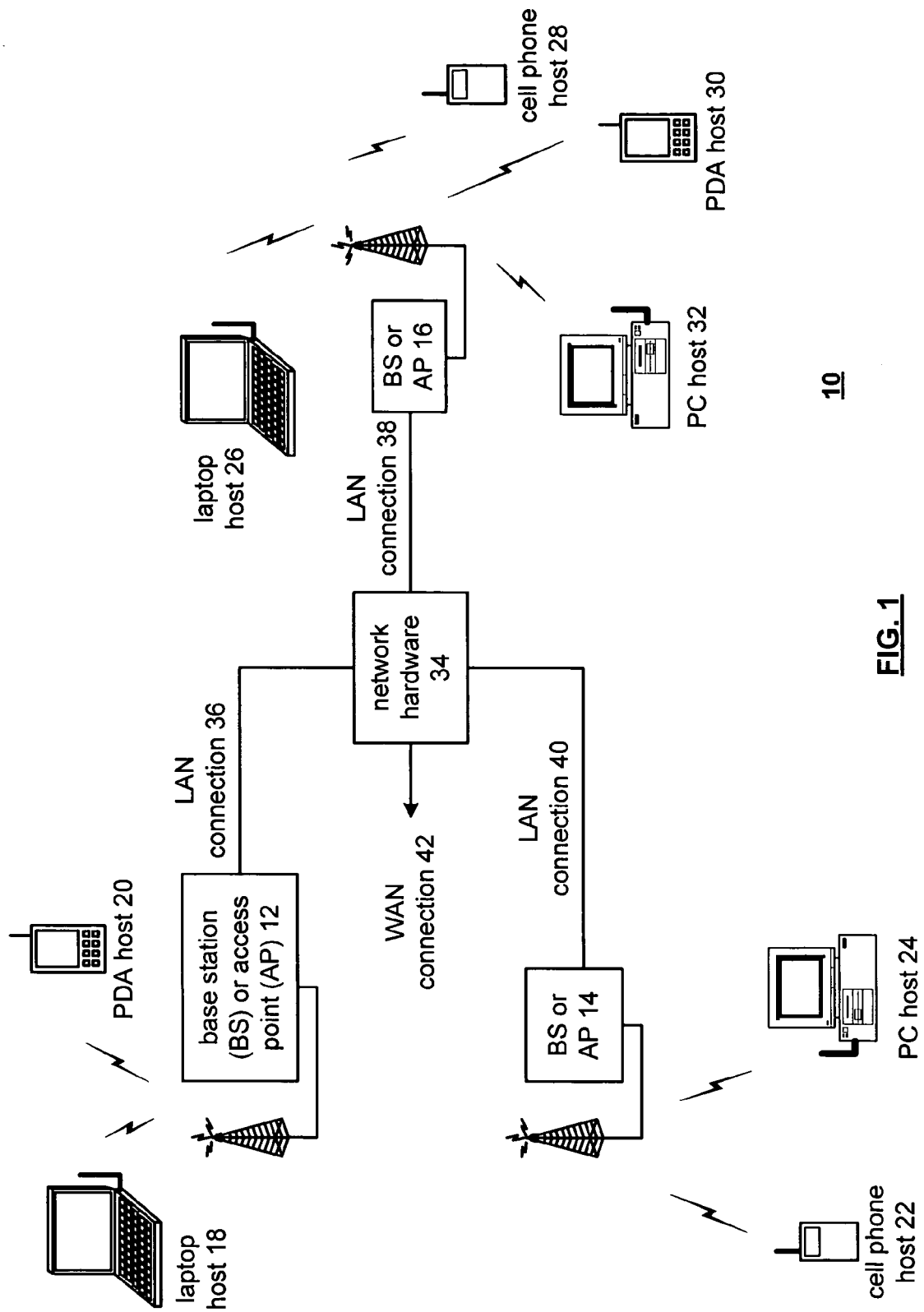
FIG. 1 illustrates a schematic block diagram of a wireless communication system in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes an integrated RF front-end architecture as disclosed herein to enhance performance of radio frequency integrated circuits.

Figure 2:
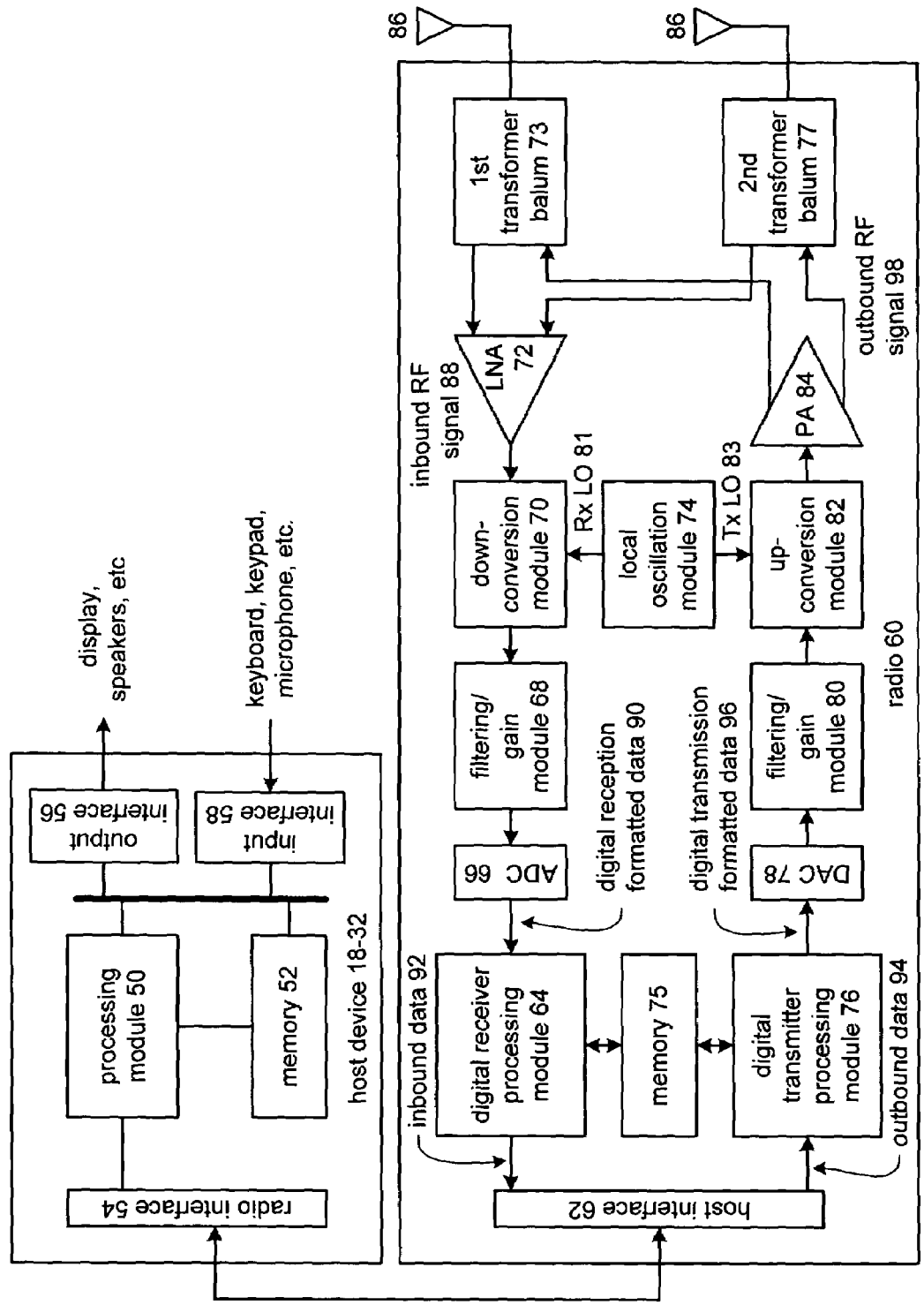
FIG. 2 illustrates a schematic block diagram of a wireless communication device in accordance with the present invention.

FIG. 2 illustrates a schematic block diagram of a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides outbound data from the processing module 50 to the radio 60. The processing module 50 may receive the outbound data from an input device such as a keyboard, keypad, microphone, et cetera, via the input interface 58 or generate the data itself. For data received via the input interface 58, the processing module 50 may perform a corresponding host function on the data and/or route it to the radio 60 via the radio interface 54.

Radio 60 includes a host interface 62, a receiver section, a transmitter section, local oscillation module 74, a first transformer balun 73, a second transformer balun 77, and diversity antennas 86. The receiver section includes a digital receiver processing module 64, analog-to-digital converter 66, filtering/gain module 68, down conversion module 70, low noise amplifier (LNA) 72, which may be implemented in accordance with the teachings of the present invention, and at least a portion of memory 75. The transmitter section includes a digital transmitter processing module 76, digital-to-analog converter 78, filtering/gain module 80, up-conversion module 82, power amplifier 84, which may be implemented in accordance with the teachings of the present invention, and at least a portion of memory 75.

The diversity antennas 86 may include two or more antennas that are physically spaced by a quarter wavelength, a half wavelength, and/or a full wavelength of the RF signals. In this embodiment, two antennas are shown, where a first antenna is coupled to the first transformer balun 73 and a second antenna is coupled to the second transformer balun 77. The transformer baluns 73 and 77 convert differential signals into single-ended signals, where the single-ended signals are conveyed with the antennas 86. The transformer baluns may be constructed in accordance with the teachings of co-pending patent application entitled ON-CHIP TRANSFORMER BALUN, having a filing date of Jan. 23, 2002, and a Ser. No. 10/055,425.

The LNA 72 includes two sections that may be implemented in a variety of ways as will be described with reference to FIGS. 3–5 that are independently enabled to receive RF signals from one of the antennas. For instance, when the first antenna 86 is selected to receive the inbound RF signals, the LNA 72 receives the RF signals via the first transformer balun 73. Accordingly, the section of the LNA coupled to the first transformer balun 73 is active, while the section of the LNA coupled to the second transformer balun 77 is inactive. Conversely, when the second antenna 86 is selected to receive the inbound RF signals, the LNA 72 receives the RF signals via the second transformer balun 77. Accordingly, the section of the LNA coupled to the second transformer balun 77 is active, while the section of the LNA coupled to the first transformer balun 73 is inactive.

The PA 84 includes two sections that may be implemented in a variety of ways as will be described with reference to FIGS. 6 and 7 that are independently enabled to transmit RF signals from one of the antennas. For instance, when the first antenna 86 is selected to transmit the outbound RF signals, the PA 84 transmits the RF signals via the first transformer balun 73. Accordingly, the section of the PA coupled to the first transformer balun 73 is active, while the section of the PA coupled to the second transformer balun 77 is inactive. Conversely, when the second antenna 86 is selected to transmit the outbound RF signals, the PA 84 transmits the RF signals via the second transformer balun 77. Accordingly, the section of the PA coupled to the second transformer balun 77 is active, while the section of the PA coupled to the first transformer balun 73 is inactive.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84 amplifies the RF signal to produce outbound RF signal 98 and routes the outbound RF signal 98 to the antenna 86 via the antenna coupling structure 73. The antenna 86 transmits the outbound RF signal 98 to a targeted device such as a base station, an access point and/or another wireless communication device.

The radio 60 also receives, via the antenna 86 and the antenna coupling structure 73, an inbound RF signal 88, which can be transmitted by a base station, an access point, or another wireless communication device. The antenna coupling structure 73 provides the inbound RF signal 88 to the LNA 72, which amplifies the signal 88 to produce an amplified inbound RF signal. The RF front-end 72 provides the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the radio may be implemented in a variety of ways to receive RF signals and to transmit RF signals and may be implemented using a single integrated circuit or multiple integrated circuits. Further, at least some of the modules of the radio 60 may be implemented on the same integrated circuit with at least some of the modules of the host device 18–32. Regardless of how the radio is implemented, the concepts of the present invention are applicable.

Figure 3:
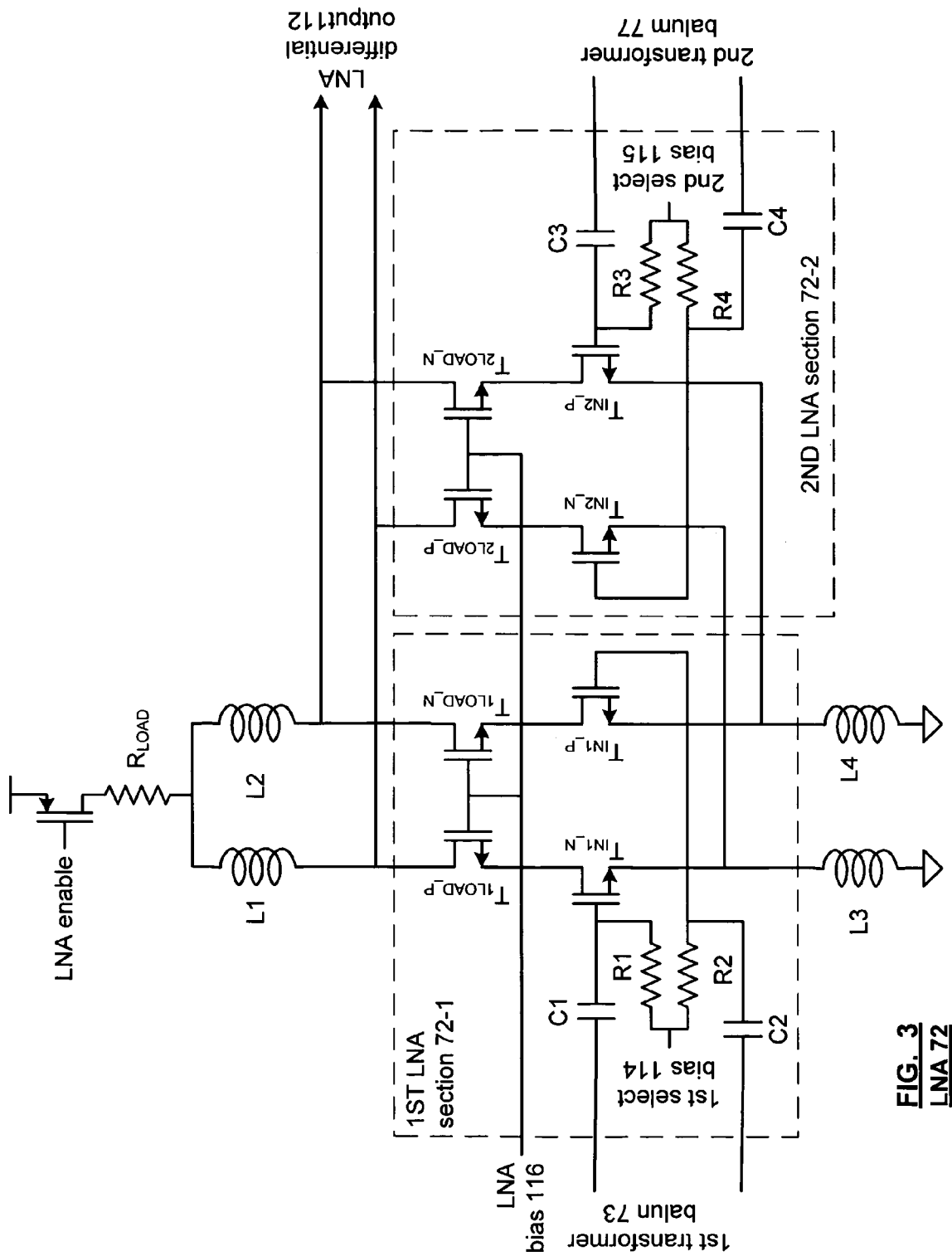
FIG. 3 illustrates a schematic block diagram of a low noise amplifier in accordance with the present invention.

FIG. 3 is a schematic block diagram of an embodiment of the low noise amplifier 72 including a first LNA section 72-1, a second LNA section 72-2, an enable switch, a resistive load ($R_{LOAD}$), load inductors L1 and L2, and input inductors L3 and L4. The first LNA section 72-1 includes a first selectable bias circuit, input transistors ($T_{IN1\_N}$) and ($T_{IN1\_P}$), and load transistors ($T_{1LOAD\_N}$) and ($T_{1LOAD\_P}$).

The first selectable bias circuit includes capacitors C1 and C2 and resistors R1 and R2 coupled to receive a first select bias 114 and to the first transformer balun 73. The second LNA section 72-2 includes a second selectable bias circuit, input transistors ($T_{IN2\_N}$) and ($T_{IN2\_P}$), and load transistors ($T_{2LOAD\_N}$) and ($T_{2LOAD\_P}$). The second selectable bias circuit includes capacitors C3 and C4 and resistors R3 and R4 coupled to receive a second select bias 115 and to the second transformer balun 77. In this embodiment, the load transistors ($T_{1LOAD\_N}$), ($T_{1LOAD\_P}$), ($T_{2LOAD\_N}$) and ($T_{2LOAD\_P}$) of both sections are biased to the same voltage (LNA bias 116).

In operation, when the RF signals are to be received via the first transformer balun 73, the first select bias 114 is set to a level to enable the input transistors ($T_{IN1\_N}$) and ($T_{IN1\_P}$) of the first LNA section 72-1 and the second select bias 115 is set to a voltage that holds the input transistors ($T_{IN2\_N}$) and ($T_{IN2\_P}$) of the second LNA section 72-2 off. With the input transistors of the second LNA section 72-2 disabled, the $2^{nd}$ LNA section 72-2 is disabled, thus only the first LNA section 72-1 is active. With the first LNA section 72-1 active, the first LNA section amplifies the differential signals received with the load inductors and resistive load, produces the LNA differential output 112.

Conversely, when the RF signals are to be received via the second transformer balun 77, the second select bias 115 is set to a level to enable the input transistors ($T_{IN2\_N}$) and ($T_{IN2\_P}$) of the second LNA section 72-2 and the first select bias 114 is set to a voltage that holds the input transistors ($T_{IN1\_N}$) and ($T_{IN1\_P}$) of the first LNA section 72-1 off. With the input transistors of the first LNA section 72-1 disabled, the first LNA section 72-1 is disabled, thus only the second LNA section 72-2 is active. With the second LNA section 72-2 active, the second LNA section amplifies the differential signals received via the second transformer balun 77 and, in conjunction with the load inductors and resistive load, produces the LNA differential output 112.

Figure 4:
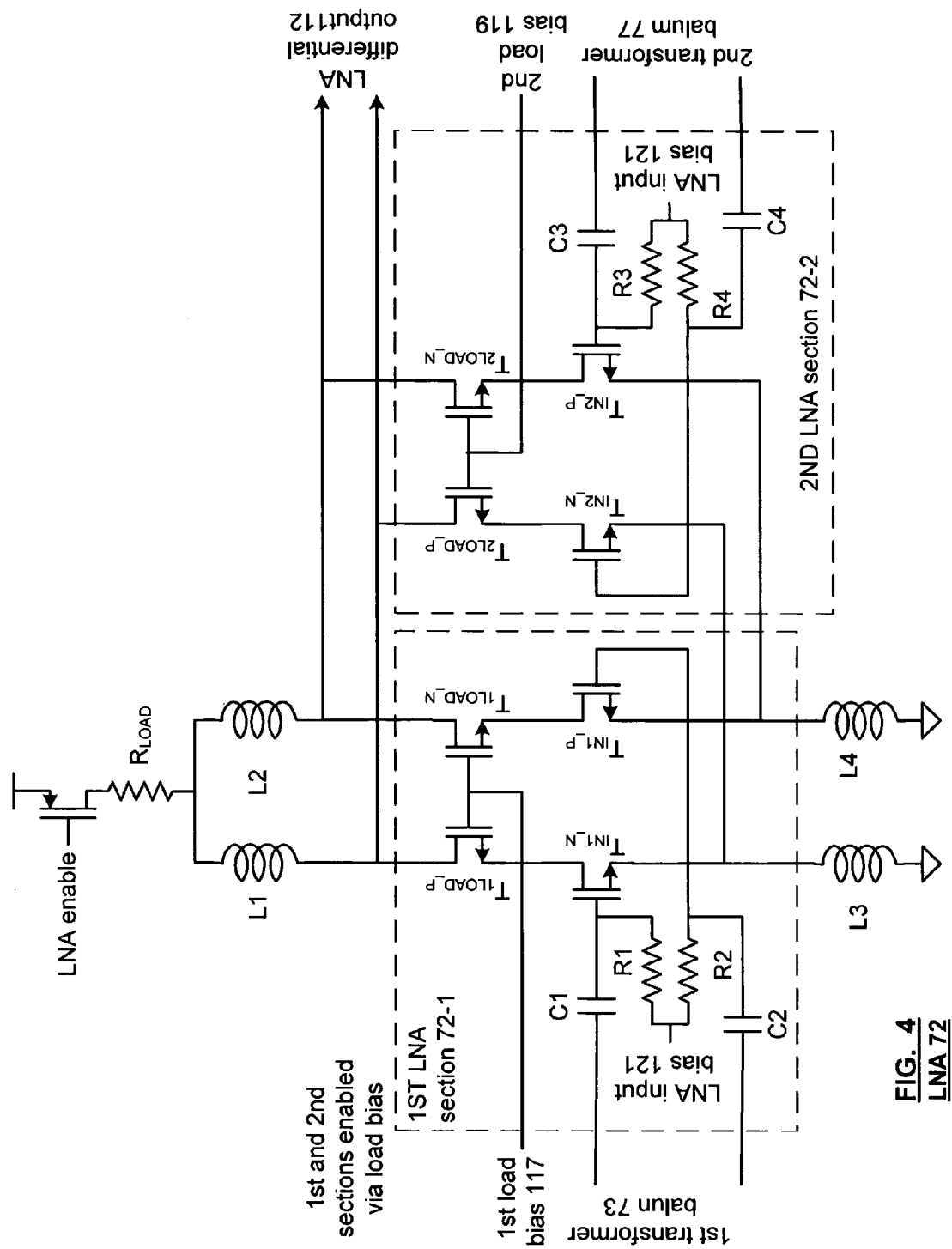
FIG. 4 illustrates a schematic block diagram of another low noise amplifier in accordance with the present invention.

FIG. 4 is a schematic block diagram of an embodiment of the low noise amplifier 72 including a first LNA section 72-1, a second LNA section 72-2, an enable switch, a resistive load ($R_{LOAD}$), load inductors L1 and L2, and input inductors L3 and L4. The first LNA section 72-1 includes a first selectable bias circuit, input transistors ($T_{IN1\_N}$) and ($T_{IN1\_P}$), and load transistors ($T_{1LOAD\_N}$) and ($T_{1LOAD\_P}$). The first selectable bias circuit includes capacitors C1 and C2 and resistors R1 and R2 coupled to receive an LNA input bias 121 and to the first transformer balun 73. The second LNA section 72-2 includes a second selectable bias circuit, input transistors ($T_{IN2\_N}$) and ($T_{IN2\_P}$), and load transistors ($T_{2LOAD\_N}$) and ($T_{2LOAD\_P}$). The second selectable bias circuit includes capacitors C3 and C4 and resistors R3 and R4 coupled to receive the LNA input bias and to the second transformer balun 77. In this embodiment, the load transistors ($T_{1LOAD\_N}$) and ($T_{1LOAD\_P}$) of the first LNA section 72-1 are biased by a first load bias 117 and the load transistors ($T_{2LOAD\_N}$) and ($T_{2LOAD\_P}$) of the second LNA section 72-2 are biased by a second load bias 119. Note that the LNA input bias 121 is of a voltage to active the input transistors ($T_{IN1\_N}$), ($T_{IN1\_P}$), ($T_{IN2\_N}$) and ($T_{IN2\_P}$) of both LNA sections.

In operation, when the RF signals are to be received via the first transformer balun 73, the first load bias 117 is set to a level to enable the load transistors ($T_{1LOAD\_N}$) and ($T_{1LOAD\_P}$) of the first LNA section 72-1 and the second load bias 119 is set to a voltage that holds the load transistors ($T_{2LOAD\_N}$) and ($T_{2LOAD\_P}$) of the second LNA section 72-2 off. With the load transistors of the second LNA section 72-2 disabled, the $2^{nd}$ LNA section 72-2 is disabled, thus only the first LNA section 72-1 is active. With the first LNA section 72-1 active, the first LNA section amplifies the differential signals received via the first transformer balun 73 and, in conjunction with the load inductors and resistive load, produces the LNA differential output 112.

Conversely, when the RF signals are to be received via the second transformer balun 77, the second load bias 119 is set to a level to enable the load transistors ($T_{2LOAD\_N}$) and ($T_{2LOAD\_P}$) of the second LNA section 72-2 and the first load bias 117 is set to a voltage that holds the load transistors ($T_{1LOAD\_N}$) and ($T_{1LOAD\_P}$) of the first LNA section 72-1 off. With the load transistors of the first LNA section 72-1 disabled, the first LNA section 72-1 is disabled, thus only the second LNA section 72-2 is active. With the second LNA section 72-2 active, the second LNA section amplifies the differential signals received via the second transformer balun 77 and, in conjunction with the load inductors and resistive load, produces the LNA differential output 112.

Figure 5:
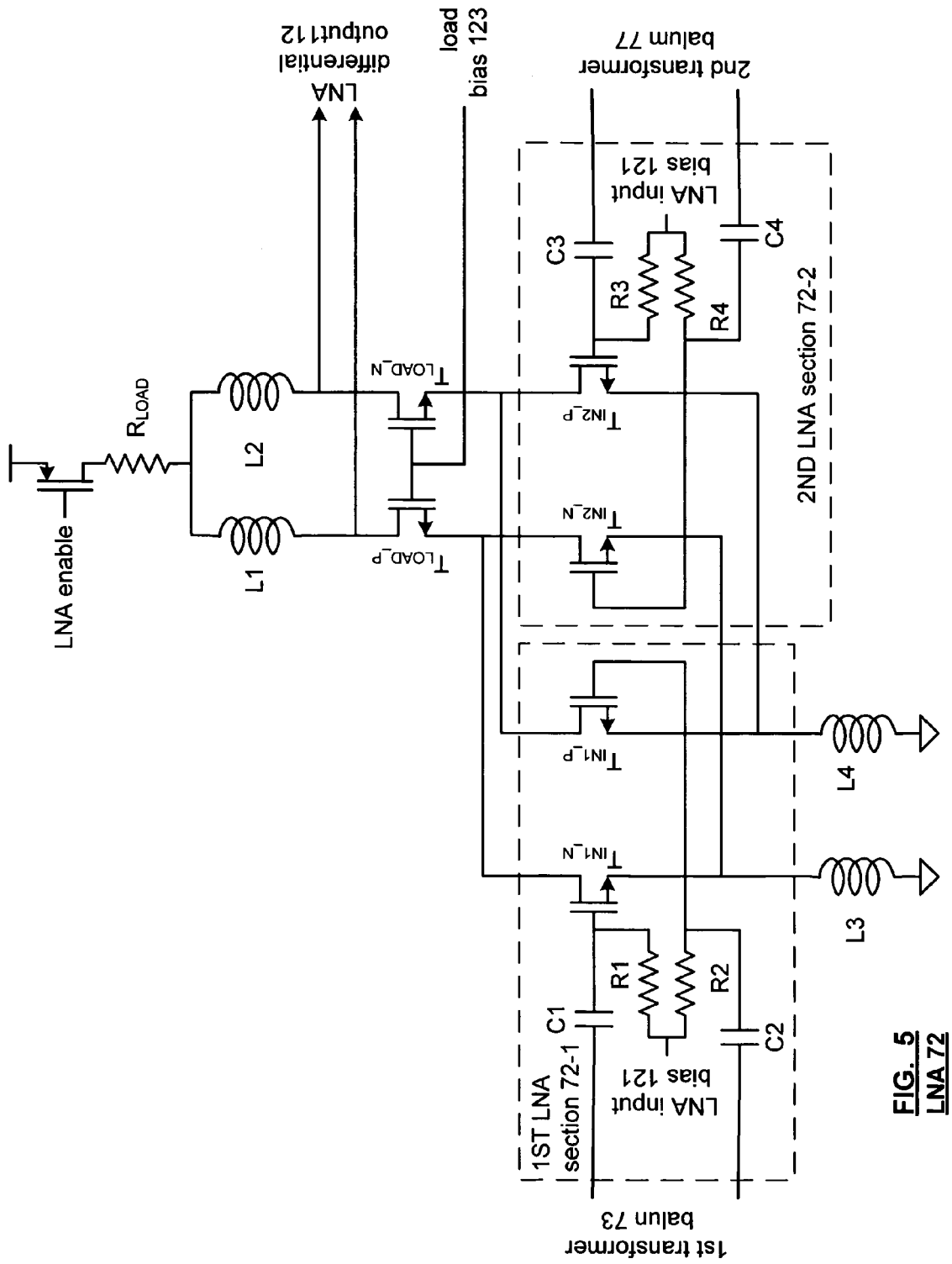
FIG. 5 illustrates a schematic block diagram of yet another low noise amplifier in accordance with the present invention.

FIG. 5 is a schematic block diagram of an embodiment of the low noise amplifier 72 including a first LNA section 72-1, a second LNA section 72-2, an enable switch, load transistors ($T_{LOAD\_N}$) and ($T_{LOAD\_P}$), a resistive load ($R_{LOAD}$), load inductors L1 and L2, and input inductors L3 and L4. The first LNA section 72-1 includes a first selectable bias circuit and input transistors ($T_{IN1\_N}$) and ($T_{IN1\_P}$). The first selectable bias circuit includes capacitors C1 and C2 and resistors R1 and R2 coupled to receive a first select bias 114 and to the first transformer balun 73. The second LNA section 72-2 includes a second selectable bias circuit and input transistors ($T_{IN2\_N}$) and ($T_{IN2\_P}$). The second selectable bias circuit includes capacitors C3 and C4 and resistors R3 and R4 coupled to receive a second select bias 115 and to the second transformer balun 77. In this embodiment, the load transistors ($T_{LOAD\_N}$) and ($T_{LOAD\_P}$) are biased to the same voltage (load bias 123) such that the load transistors are enabled.

In operation, when the RF signals are to be received via the first transformer balun 73, the first select bias 114 is set to a level to enable the input transistors ($T_{IN1\_N}$) and ($T_{IN1\_P}$) of the first LNA section 72-1 and the second select bias 115 is set to a voltage that holds the input transistors ($T_{IN2\_N}$) and ($T_{IN2\_P}$) of the second LNA section 72-2 off. With the input transistors of the second LNA section 72-2 disabled, the $2^{nd}$ LNA section 72-2 is disabled, thus only the first LNA section 72-1 is active. With the first LNA section 72-1 active, the first LNA section amplifies the differential signals received via the first transformer balun 73 and, in conjunction with the load inductors, load transistors, and resistive load, produces the LNA differential output 112.

Conversely, when the RF signals are to be received via the second transformer balun 77, the second select bias 115 is set to a level to enable the input transistors ($T_{IN2\_N}$) and ($T_{IN2\_P}$) of the second LNA section 72-2 and the first select bias 114 is set to a voltage that holds the input transistors ($T_{IN1\_N}$) and ($T_{IN1\_P}$) of the first LNA section 72-1 off. With the input transistors of the first LNA section 72-1 disabled, the first LNA section 72-1 is disabled, thus only the second LNA section 72-2 is active. With the second LNA section 72-2 active, the second LNA section amplifies the differential signals received via the second transformer balun 77 and, in conjunction with the load inductors, the load transistors, and resistive load, produces the LNA differential output 112.

Figure 6:
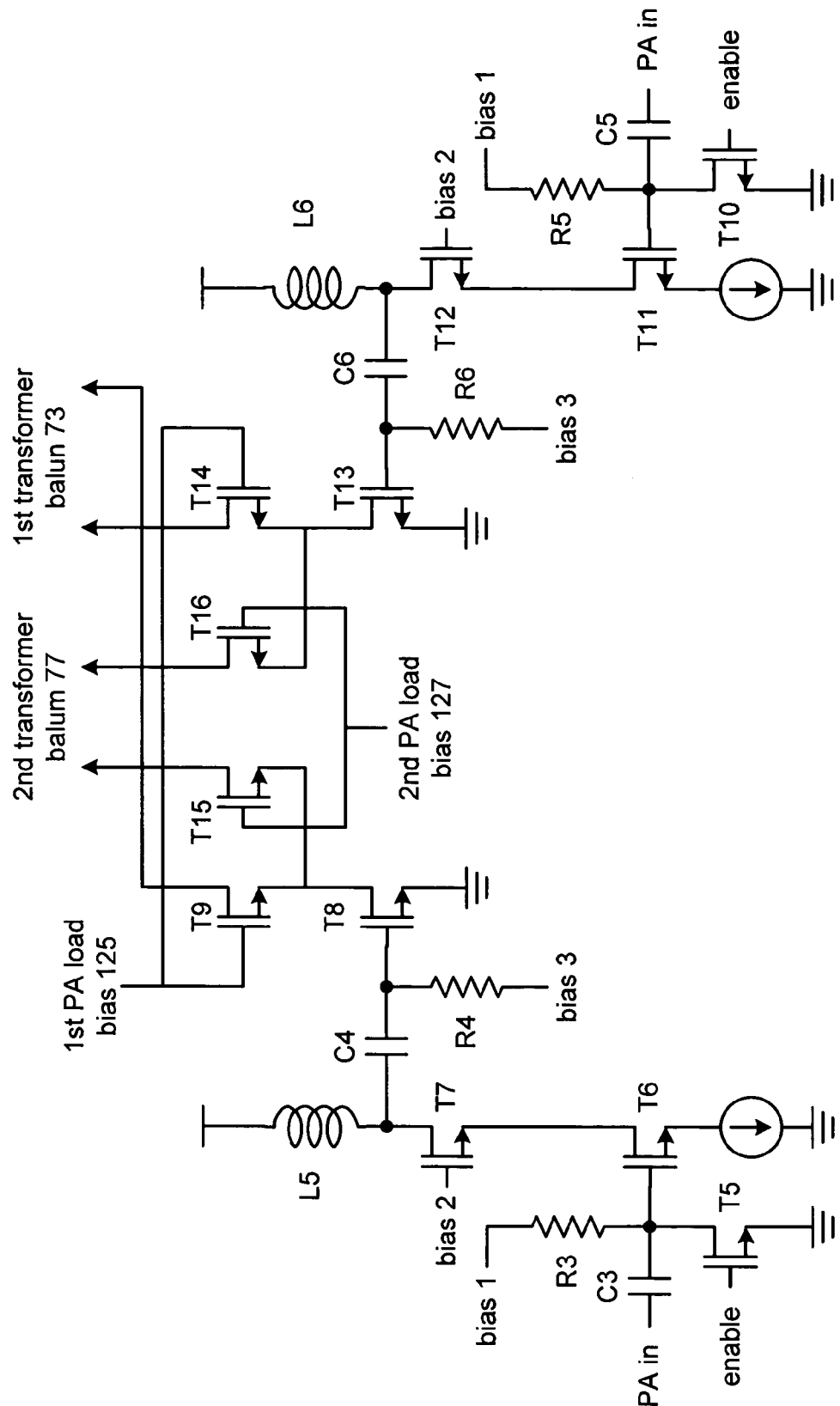
FIG. 6 illustrates a schematic block diagram of a power amplifier in accordance with the present invention.

FIG. 6 is a schematic block diagram of a power amplifier 84 that includes an input section and two output sections.

One of the output sections couples to the first transformer balun 73 and the second output section coupled to the second transformer balun 77. The input section includes enable transistors T5 and T10, input transistors T6 and T11, drive transistors T7 and T12, input capacitors C3 and C5, bias resistors R3 and R5, and current sources. The first output section includes output transistors T9 and T14 and output gating circuitry that includes transistors T8 and T13, capacitors C4 and C6, and resistors R4 and R6. The second output section includes output transistors T15 and T16 and the output gating circuitry.

In operation, the input section receives differential outbound RF signals via the input transistors T6 and T11. With proper biasing of transistors T6, T11, T7, and T12, a current that represents the differential outbound RF signals is flowing through inductors L5 and L6. Based on the currents, a voltage is imposed across the inductors L5 and L6, with reference to the supply voltage. This voltage is coupled via capacitors C4 and C6 to transistors T8 and T13. When the differential outbound RF signals are to be provided to the first transformer balun 73, the first PA load bias 125 is a logic low and the second PA load bias 127 is a logic high. With the PA load biases 125 and 127 in these states, transistors T9 and T14 are active and transistors T15 and T16 are inactive. As such, the amplified outbound RF signals are provided to the first transformer balun 73.

Conversely, when the amplified outbound RF signals are to be provided to the second transformer balun 77, the first PA load bias 125 is a logic high and the second PA load bias 127 is a logic low. With the PA load biases 125 and 127 in these states, transistors T9 and T14 are inactive and transistors T15 and T16 are active. As such, the amplified outbound RF signals are provided to the second transformer balun 77.

Figure 7:
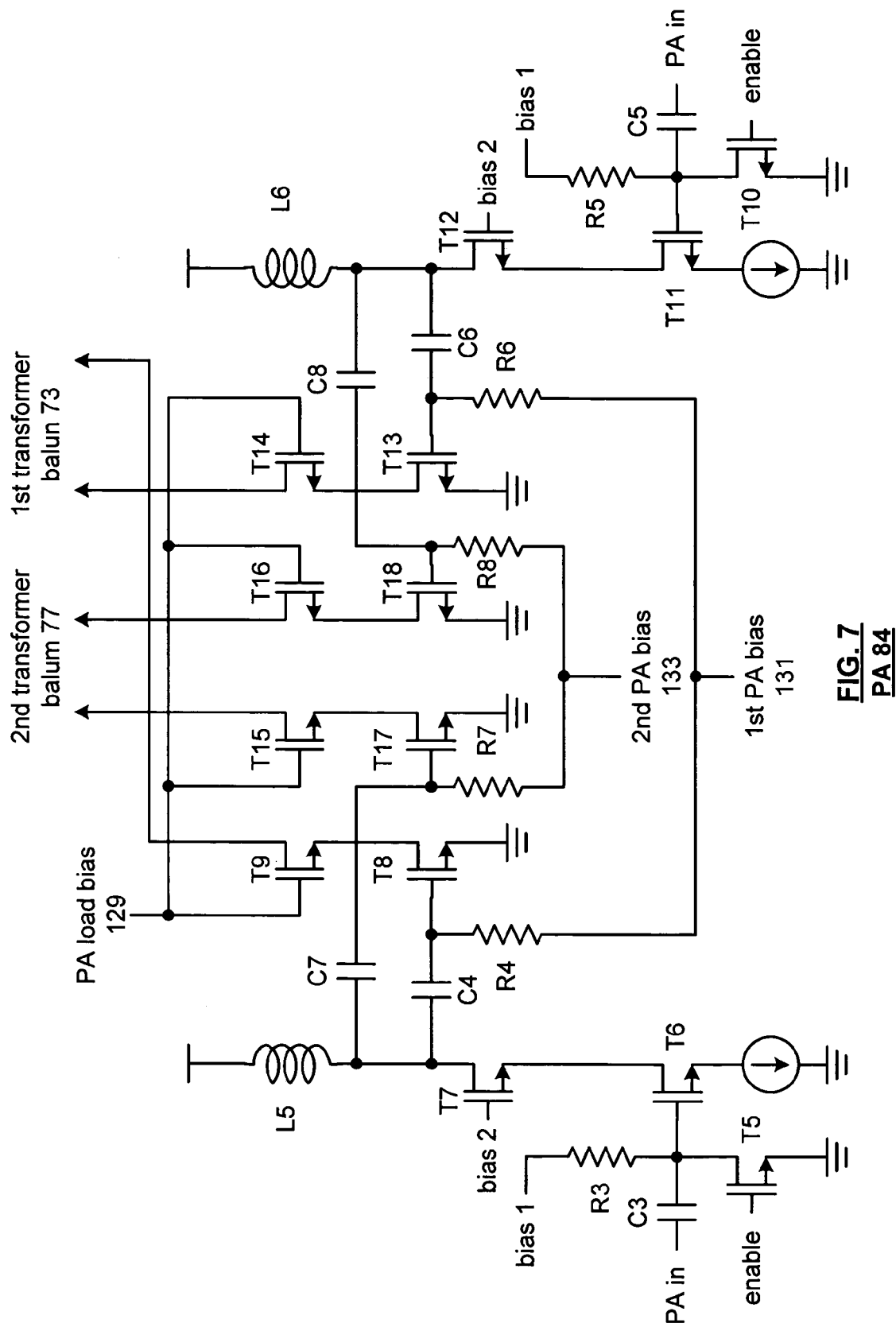
FIG. 7 illustrates a schematic block diagram of another power amplifier in accordance with the present invention.

FIG. 7 is a schematic block diagram of a power amplifier 84 that includes an input section and two output sections. One of the output sections couples to the first transformer balun 73 and the second output section coupled to the second transformer balun 77. The input section includes enable transistors T5 and T10, input transistors T6 and T11, drive transistors T7 and T12, input capacitors C3 and C5, bias resistors R3 and R5, and current sources. The first output section includes output transistors T8, T9, T13, and T14, capacitors C4 and C6 and resistors R4 and R6. The second output section includes output transistors T15, T16, T17, and T18, capacitors C7 and C8 and resistors R7 and R8.

In operation, the input section receives differential outbound RF signals via the input transistors T6 and T11. With proper biasing of transistors T6, T11, T7, and T12, a current that represents the differential outbound RF signals is flowing through inductors L5 and L6. Based on the currents, a voltage is imposed across the inductors L5 and L6, with reference to the supply voltage. This voltage is coupled via capacitors C4 and C6 to transistors T8 and T13 and to transistors T17 and T18 via capacitors C7 and C8. When the differential outbound RF signals are to be provided to the first transformer balun 73, the first PA bias 131 is of a voltage to enable transistors T8 and T13 and the second PA bias 133 is of a voltage to inactivate transistors T17 and T18. With the PA biases 131 and 133 in these states, transistors T9 and T14 are active and transistors T15 and T16 are inactive. As such, the amplified outbound RF signals are provided to the first transformer balun 73.

Conversely, when the amplified outbound RF signals are to be provided to the second transformer balun 77, the first PA bias 131 is of a voltage that inactivates transistors T8 and T9 and the second PA bias 133 is of a voltage that activates transistors T17 and T18. With the PA biases 131 and 133 in these states, transistors T9 and T14 are inactive and transistors T15 and T16 are active. As such, the amplified outbound RF signals are provided to the second transformer balun 77.

As one of average skill in the art will appreciate, another embodiment of the power amplifier 84 may implemented where the first power amplifier section includes a first input stage and a first output drive stage, wherein the first input section includes AC coupling capacitors, input transistors, first output transistors, first loads, and first drive stage AC coupling capacitors. The AC coupling capacitors are operably coupled to provide the outbound RF signal to the input transistors, wherein the input transistors are operably coupled to the first output transistors, wherein the first output transistors are operably coupled to the first loads. When enabled via a first bias voltage, the first output transistors provide, in combination with the first loads and via the first driver stage AC coupling capacitors, a first intermediate amplifier outbound RF signal to the first output drive stage, and wherein the first output drive stage provides the first amplifier RF signal.

The second power amplifier section includes a second input stage and a second output drive stage. The second input section includes the AC coupling capacitors, the input transistors, second output transistors, second loads, and second drive stage AC coupling capacitors. The AC coupling capacitors are operably coupled to provide the outbound RF signal to the input transistors, wherein the input transistors are operably coupled to the second output transistors, and wherein the second output transistors are operably coupled to the second loads. When enabled via a second bias voltage, the second output transistors provide, in combination with the second loads and via the second driver stage AC coupling capacitors, a second intermediate amplifier outbound RF signal to the second output drive stage, wherein the second output drive stage provides the second amplifier RF signal.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a radio frequency integrated circuit having a diversity antenna structure. To support an on-chip diversity antenna structure, the low noise amplifier and power amplifier may be implemented in accordance with the teachings of the present invention. As one of average skill in the art will appreciate, other embodiments may be derived from the teachings of the present invention without deviating from the scope of the claims.

What is claimed is:

1. A power amplifier structure comprises:
   a first transformer balun operably coupled to a first antenna of a diversity antenna structure;
   a second transformer balun operably coupled to a second antenna of a diversity antenna structure;
   a first power amplifier section; and
   a second power amplifier section, wherein the first and second power amplifier sections amplify an outbound radio frequency (RF) signal to produce a first amplified outbound RF signal and a second amplified outbound RF signal, respectively, and wherein the first amplified outbound RF signal is provided to the first transformer balun and the second amplified outbound RF signal is provided to the second transformer balun.

2. The power amplifier structure of claim 1 further comprises:
   the first power amplifier section including an input stage and a first output drive stage, wherein the input stage is operably coupled to amplify the outbound RF signal to produce an intermediate amplified outbound RF signal, wherein the first output drive stage includes input transistors and first output drive transistors, wherein the input transistors are operably coupled to receive the intermediate amplified output RF signal and operably coupled to the first output driver transistors, wherein, when enabled via a first bias voltage, the first output drive transistors provide the first amplified outbound RF signal; and
   the second power amplifier section including the input stage and a second output drive stage, wherein the input stage is operably coupled to amplify the outbound RF signal to produce the intermediate amplified outbound RF signal, wherein the second output drive stage includes the input transistors and second output drive transistors, wherein the input transistors are operably coupled to receive the intermediate amplified output RF signal and operably coupled to the second output driver transistors, wherein, when enabled via a second bias voltage, the second output drive transistors provide the second amplified outbound RF signal.

3. The power amplifier structure of claim 1 further comprises:
   the first power amplifier section including an input stage and a first output drive stage, wherein the input stage is operably coupled to amplify the outbound RF signal to produce an intermediate amplified outbound RF signal, wherein the first output drive stage includes first input transistors and first output drive transistors, wherein, when enabled via a first input bias voltage, the first input transistors are operably coupled to receive the intermediate amplified output RF signal and operably coupled to the first output driver transistors, wherein the first output drive transistors provide the first amplified outbound RF signal; and
   the second power amplifier section including the input stage and a second output drive stage, wherein the input stage is operably coupled to amplify the outbound RF signal to produce the intermediate amplified outbound RF signal, wherein the second output drive stage includes second input transistors and second output drive transistors, wherein, when enabled via a second input bias voltage, the second input transistors are operably coupled to receive the intermediate amplified output RF signal and operably coupled to the second output driver transistors, wherein the second output drive transistors provide the second amplified outbound RF signal.

4. The power amplifier structure of claim 1 further comprises:
   the first power amplifier section including a first input stage and a first output drive stage, wherein the first input section includes AC coupling capacitors, input transistors, first output transistors, first loads, and first drive stage AC coupling capacitors, wherein the AC coupling capacitors are operably coupled to provide the outbound RF signal to the input transistors, wherein the input transistors are operably coupled to the first output transistors, wherein the first output transistors are operably coupled to the first loads, wherein, when enabled via a first bias voltage, the first output transistors provide, in combination with the first loads and via the first driver stage AC coupling capacitors, a first intermediate amplifier outbound RF signal to the first output drive stage, and wherein the first output drive stage provides the first amplified outbound RE signal; and
   the second power amplifier section including a second input stage and a second output drive stage, wherein the second input section includes the AC coupling capacitors, the input transistors, second output transistors, second loads, and second drive stage AC coupling capacitors, wherein the AC coupling capacitors are operably coupled to provide the outbound RF signal to the input transistors, wherein the input transistors are operably coupled to the second output transistors, wherein the second output transistors are operably coupled to the second loads, wherein, when enabled via a second bias voltage, the second output transistors provide, in combination with the second loads and via the second driver stage AC coupling capacitors, a second intermediate amplifier outbound RF signal to the second output drive stage, and wherein the second output drive stage provides the second amplified outbound RF signal.

5. A low noise amplifier structure comprises:
   a first transformer balun operably coupled to a first antenna of a diversity antenna structure;
   a second transformer balun operably coupled to a second antenna of a diversity antenna structure;
   a first low noise amplifier section; and
   a second low noise amplifier section, wherein, when enabled, the first low noise amplifier section amplifies a first inbound RF signal to produce a first amplified inbound RF signal, wherein, when enabled, the second low noise amplifier section amplifies a second inbound RF signal to produce a second amplified inbound RF signal, wherein the first inbound RF signal is received via the first transformer balun and the second inbound RF signal is received via the second transformer balun.

6. The low noise amplifier structure of claim 5 further comprises:
   the first low noise amplifier section including a first selectable bias circuit, first AC coupling capacitors, first input transistors, and first load transistors, wherein the first AC coupling capacitors are operably coupled to the first transformer balun and to the first input transistors, wherein the first selectable bias circuit is operably coupled to selectively bias the first input transistors, wherein the first load transistors are operably coupled to the first input transistors and to loads that provide an output of the low noise amplifier, and wherein the first load transistors are biased via a low noise amplifier bias; and the second low noise amplifier section including a second selectable bias circuit, second AC coupling capacitors, second input transistors, and second load transistors, wherein the second AC coupling capacitors are operably coupled to the second transformer balun and to the second input transistors, wherein the second selectable bias circuit is operably coupled to selectively bias the second input transistors, wherein the second load transistors are operably coupled to the loads and the second input transistors, and wherein the second load transistors are biased via the low noise amplifier bias.

7. The low noise amplifier structure of claim 5 further comprises:

the first low noise amplifier section including a first selectable bias circuit, first AC coupling capacitors, first input transistors, and first load transistors, wherein the first AC coupling capacitors are operably coupled to the first transformer balun and to the first input transistors, wherein the first selectable bias circuit is operably coupled to selectively bias the first load transistors, wherein the first load transistors are operably coupled to the first input transistors and to loads that provide an output of the low noise amplifier, and wherein the first input transistors are biased via a low noise amplifier bias; and the second low noise amplifier section including a second selectable bias circuit, second AC coupling capacitors, second input transistors, and second load transistors, wherein the second AC coupling capacitors are operably coupled to the second transformer balun and to the second input transistors, wherein the second selectable bias circuit is operably coupled to selectively bias the second load transistors, wherein the second load transistors are operably coupled to the loads and the second input transistors, and wherein the second input transistors are biased via the low noise amplifier bias.

8. The low noise amplifier structure of claim 5 further comprises:

the first low noise amplifier section including a first selectable bias circuit, first AC coupling capacitors, and first input transistors, wherein the first AC coupling capacitors are operably coupled to the first transformer balun and to the first input transistors, wherein the first selectable bias circuit is operably coupled to selectively bias the first input transistors, and wherein the first input transistors are operably coupled to load transistors that are operably coupled to loads that provide an output of the low noise amplifier; and the second low noise amplifier section including a second selectable bias circuit, second AC coupling capacitors, and second input transistors, wherein the second AC coupling capacitors are operably coupled to the second transformer balun and to the second input transistors, wherein the second selectable bias circuit is operably coupled to selectively bias the second input transistors, wherein the second input transistors are operably coupled to the load transistors.

* * * * *